(12) United States Patent
Hamanaka

(10) Patent No.: US 7,382,152 B2
(45) Date of Patent: Jun. 3, 2008

(54) I/O INTERFACE CIRCUIT OF INTEGRATED CIRCUIT

(75) Inventor: Shinsuke Hamanaka, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 103 days.

(21) Appl. No.: 10/968,114

(22) Filed: Oct. 20, 2004

(65) Prior Publication Data
US 2005/0088150 A1  Apr. 28, 2005

(30) Foreign Application Priority Data
Oct. 23, 2003  (JP) .............................. 2003-363822

(51) Int. Cl.
*H03K 17/16* (2006.01)
*H03K 19/003* (2006.01)

(52) U.S. Cl. ........................... 326/30; 326/21; 327/108

(58) Field of Classification Search ................... 326/30
See application file for complete search history.

(56) References Cited

U.S. PATENT DOCUMENTS

| | | | | |
|---|---|---|---|---|
| 5,414,525 | A * | 5/1995 | Ito ............................. | 382/234 |
| 5,602,494 | A * | 2/1997 | Sundstrom ................... | 326/39 |
| 6,064,224 | A * | 5/2000 | Esch et al. ................... | 326/30 |
| 6,087,847 | A * | 7/2000 | Mooney et al. ............... | 326/30 |
| 6,114,895 | A * | 9/2000 | Stephens .................... | 327/391 |
| 6,204,683 | B1 * | 3/2001 | Falconer ..................... | 326/30 |
| 6,288,563 | B1 * | 9/2001 | Muljono et al. .............. | 326/27 |
| 6,307,424 | B1 * | 10/2001 | Lee ............................. | 327/530 |
| 6,329,836 | B1 * | 12/2001 | Drost et al. .................. | 326/30 |
| 6,366,129 | B1 * | 4/2002 | Douglas et al. .............. | 326/86 |
| 6,384,621 | B1 * | 5/2002 | Gibbs et al. ................. | 326/30 |
| 6,414,525 | B2 * | 7/2002 | Urakawa .................... | 327/112 |
| 6,466,487 | B1 * | 10/2002 | Otsuka .................... | 365/189.05 |
| 6,567,318 | B2 * | 5/2003 | Bedarida et al. ........ | 365/189.05 |
| 6,573,746 | B2 * | 6/2003 | Kim et al. .................... | 326/30 |
| 6,642,742 | B1 * | 11/2003 | Loyer .......................... | 326/30 |
| 6,690,211 | B1 * | 2/2004 | Huang et al. ................ | 327/108 |
| 6,717,455 | B2 * | 4/2004 | Mughal et al. ............. | 327/378 |

(Continued)

FOREIGN PATENT DOCUMENTS

JP  10-224201  8/1998

(Continued)

OTHER PUBLICATIONS

Japanese Office Action dated Oct. 16, 2007, with partial English language translation.

*Primary Examiner*—Rexford Barnie
*Assistant Examiner*—White Dylan
(74) *Attorney, Agent, or Firm*—McGinn IP Law Group, PLLC

(57) ABSTRACT

A plurality of transistor pairs of Pch and Nch transistors are connected in series between VDD and GND. An I/O terminal is connected to each connection point of the transistor pairs. Two transistor pairs constitute one transistor set, in which each of two Pch transistors and two Nch transistors have the same on-resistance. In input mode, one of the two transistor pairs in a first set is turned on, and a transistor pair of a second or later set is selectively turned on. In output mode, two Pch transistors or two Nch transistors of the first set are turned on, and a transistor of the second or later set is selectively turned on.

26 Claims, 11 Drawing Sheets

U.S. PATENT DOCUMENTS

| | | | |
|---|---|---|---|
| 6,756,810 B2 * | 6/2004 | Mughal et al. | 326/30 |
| 6,828,820 B2 * | 12/2004 | Ohno | 326/30 |
| 6,836,143 B2 * | 12/2004 | Song | 326/30 |
| 6,894,547 B2 * | 5/2005 | Takahashi | 327/170 |
| 6,909,305 B1 * | 6/2005 | Li et al. | 326/30 |
| 6,937,055 B2 * | 8/2005 | Roy et al. | 326/30 |
| 6,952,112 B2 * | 10/2005 | Satou et al. | 326/30 |
| 6,963,218 B1 * | 11/2005 | Alexander et al. | 326/30 |
| 6,980,022 B1 * | 12/2005 | Shumarayev et al. | 326/30 |
| 7,038,486 B2 * | 5/2006 | Aoyama et al. | 326/30 |
| 7,084,663 B2 * | 8/2006 | Oguri | 326/30 |
| 2002/0053923 A1 * | 5/2002 | Kim et al. | 326/30 |
| 2003/0197526 A1 * | 10/2003 | Hirano | 326/30 |
| 2003/0210070 A1 * | 11/2003 | Salcido et al. | 326/30 |
| 2004/0021481 A1 * | 2/2004 | Ohno | 326/30 |
| 2005/0104620 A1 * | 5/2005 | Ueno | 326/30 |
| 2006/0066346 A1 * | 3/2006 | Tat Lim et al. | 326/30 |

FOREIGN PATENT DOCUMENTS

| | | |
|---|---|---|
| JP | 2000-151384 | 5/2000 |
| JP | 2002-94366 | 3/2002 |
| JP | 2003-133943 | 5/2003 |

* cited by examiner

Fig. 7

| CODES | BINARY CODE | | | THERMOMETER CODE(Tx=T6) | | | | | | |
|---|---|---|---|---|---|---|---|---|---|---|
| CODE NO. | B2 | B1 | B0 | T6 | T5 | T4 | T3 | T2 | T1 | T0 |
| 0 | 0 | 0 | 0 | 0 | 0 | 0 | 0 | 0 | 0 | 0 |
| 1 | 0 | 0 | 1 | 0 | 0 | 0 | 0 | 0 | 0 | 1 |
| 2 | 0 | 1 | 0 | 0 | 0 | 0 | 0 | 0 | 1 | 1 |
| 3 | 0 | 1 | 1 | 0 | 0 | 0 | 0 | 1 | 1 | 1 |
| 4 | 1 | 0 | 0 | 0 | 0 | 0 | 1 | 1 | 1 | 1 |
| 5 | 1 | 0 | 1 | 0 | 0 | 1 | 1 | 1 | 1 | 1 |

I/O INTERFACE CIRCUIT OF INTEGRATED CIRCUIT

BACKGROUND OF THE INVENTION

1. Field of the Invention

The present invention relates to a bidirectional input and output (I/O) interface circuit used for inputting and outputting data to and from an integrated circuit and, particularly, to an I/O interface circuit of an integrated circuit in which a terminator in input mode and a driver in output mode are improved.

2. Description of Related Art

In a high-speed logic circuit where a signal rises and falls quickly, it is necessary to treat a signal line as a transmission line of a distributed constant circuit, in which signal reflection matters. The signal reflection occurs at a connection point between a transmission line and a circuit with different impedance from the characteristic impedance of the transmission line. If the characteristic impedance of the transmission line is Z0, the load impedance of the same is ZL, a reflection coefficient ρ1 at a receiving end is expressed as: ρ1=(ZL−Z0)/(ZL+Z0). If the output impedance of a signal source is ZS, a reflection coefficient ρ2 at a transmitting end is expressed as: ρ2=(ZS−Z0)/(ZS+Z0). Thus, the signal reflection is doesn't occur when the transmission line is terminated with ZL=Z0 or ZS=Z0. Hence, an I/O portion of an integrated circuit has a terminator for matching impedance of another circuit with the impedance of the transmission circuit.

I/O circuits of integrated circuits thus generally include an output circuit (output buffer), an input circuit (input buffer), and a termination circuit. However, since the output circuit and the termination circuit occupy a relatively large area, separate placement of the two circuits causes increase in a chip area.

Japanese Unexamined Patent Application Publication No. 2003-133943, for example, proposes an I/O circuit of a large-scale integrated circuit (LSI) which uses a part of an output circuit also as a termination circuit to reduce the occupation area. FIG. 11 is a circuit diagram which shows this I/O interface circuit in a way to clarify the relation to the present invention.

The I/O interface circuit 110 of FIG. 11 is connected to an I/O terminal 100 connected to a transmission line outside of the LSI. The I/O interface circuit 110 includes a driver 1 as an output circuit (output buffer) and an input circuit (input buffer) 5. In the driver 1, a plurality of pairs of P-channel (Pch) transistors 2 and N-channel (Nch) transistors 3 are connected in series between a supply voltage VDD and a ground voltage GND. The connection points between the Pch transistors 2 and Nch transistors 3 are all connected to the I/O terminal 100. A controller 4 supplies a control signal to each of the gates of the Pch transistors 2 and Nch transistors 3, thereby turning on or off the transistor.

In the case of using the I/O interface circuit 110 in input mode, an input enable signal IEN inputted to the input circuit 5 is set High, and an output enable signal OEN inputted to the controller 4 is set Low. During the input mode, data is inputted to the I/O terminal 100 (Y0), transmitted through the input circuit 5, and then supplied inside the LSI as a signal Y1. Meanwhile, since the output enable signal OEN is Low, the controller 4 outputs a signal to turn on both of the Pch transistor 2 and the Nch transistor 3 of the driver 1, thus forming a terminator (Thevenin terminator) R1.

On the other hand, in the case of using the I/O interface circuit 110 in output mode, the input enable signal IEN is set Low, and the output enable signal OEN is set High. During the output mode, a signal A is inputted to the controller 4, transmitted through the driver 1, and outputted from the I/O terminal 100. When the output enable signal OEN is High and the output signal A is High, the controller 4 outputs a signal to turn on the Pch transistor 2 and turn off the Nch transistor 3 of the driver 1. This turns on all the Pch transistors 2 in the driver 1, thereby outputting the supply voltage VDD through the I/O terminal 100. When the output enable signal OEN is High and the output signal A is Low, the controller 4 outputs a signal to turn off the Pch transistors 2 and turn on the Nch transistor 3 of the driver 1. This turns on all the Nch transistors 3 in the driver 1, thereby outputting the ground voltage GND through the I/O terminal 100. In this way, a signal of High (VDD) or Low (GND) is outputted through the I/O terminal 100 in accordance with High or Low of the output signal A.

As described above, the transistors of the driver 1 serve as the terminator (Thevenin terminator) in the input mode and as the driver transistor in the output mode. The output circuit is thus used also as the termination circuit, which reduces the chip occupation area.

It has now been discovered that the I/O interface circuit 110 cannot maintain constant termination resistance since the termination resistance varies depending on variation in process conditions and temperature changes.

Further, the I/O interface circuit 110 cannot maintain constant output impedance neither since the output impedance also varies depending on variation in process conditions and temperature changes.

It has now been also discovered that the I/O interface circuit 110 cannot match the impedance with the impedance of the transmission line in at least either input or output mode since load impedance in the input mode and output impedance in the output mode are different.

SUMMARY OF THE INVENTION

According to one aspect of the present invention, there is provided an input/output interface circuit of an integrated circuit which includes a plurality of transistor pairs, an input/output terminal which is connected to a connection point of each transistor pair of the plurality of transistor pairs, and a controller which controls switching of each transistor of the plurality of transistor pairs so as to constitute an output buffer in output mode and a termination circuit in input mode. The controller controls output impedance of the output buffer and load impedance of the termination circuit in such a way that they have a predetermined value.

The present invention allows providing constant termination resistance (load impedance) in input mode without depending on variation in process conditions and temperature changes. It also allows providing constant output impedance in output mode without depending on variation in process conditions and temperature changes.

Further, the present invention allows equalizing the load impedance in input mode and the output impedance in output mode so as to match the impedance with the impedance of a transmission line both in the input and output modes, which can offer higher-speed signal transmission.

BRIEF DESCRIPTION OF THE DRAWINGS

The objects, advantages and features of the present invention will be more apparent from the following description taken in conjunction with the accompanying drawings, in which:

FIG. 7 is a conversion table of a binary code and a thermometer code;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Figure 1:
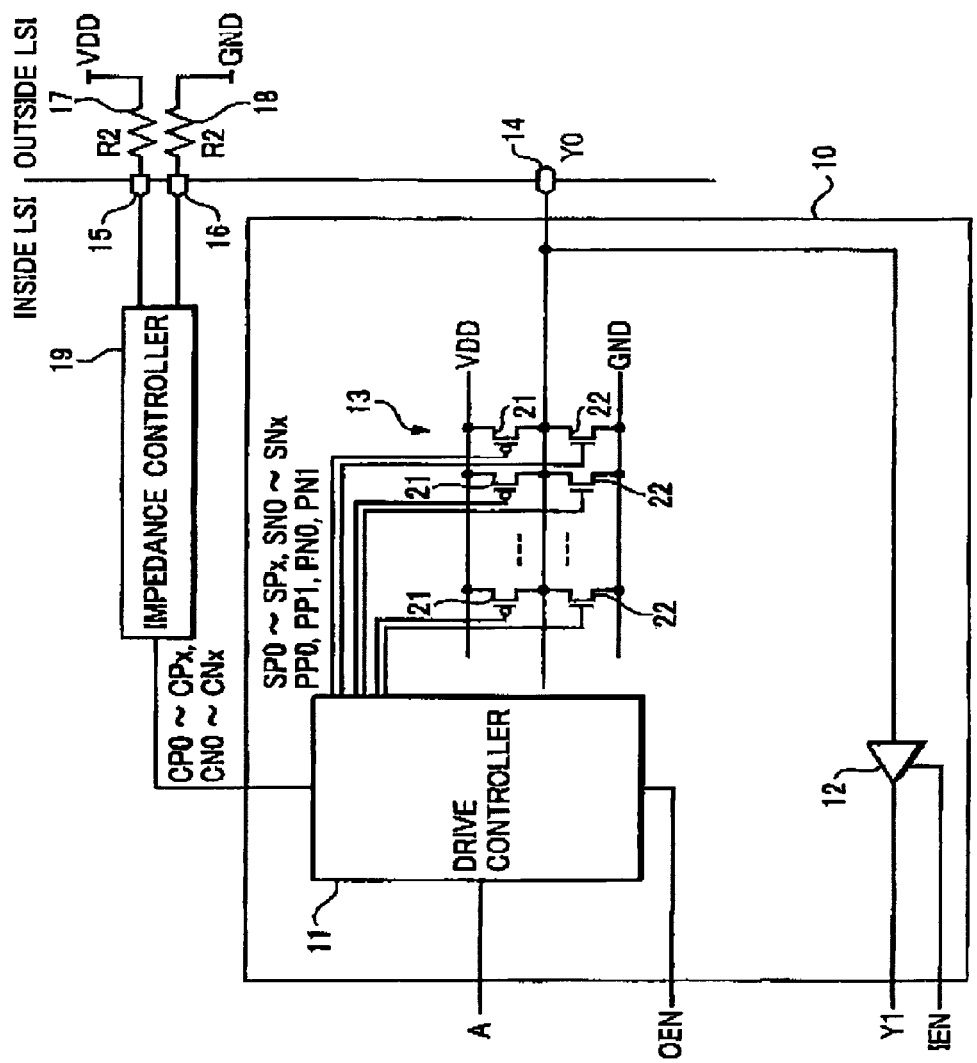
FIG. 1 is a block diagram illustrating an I/O interface circuit according to an embodiment of the present invention.
Figure 2:
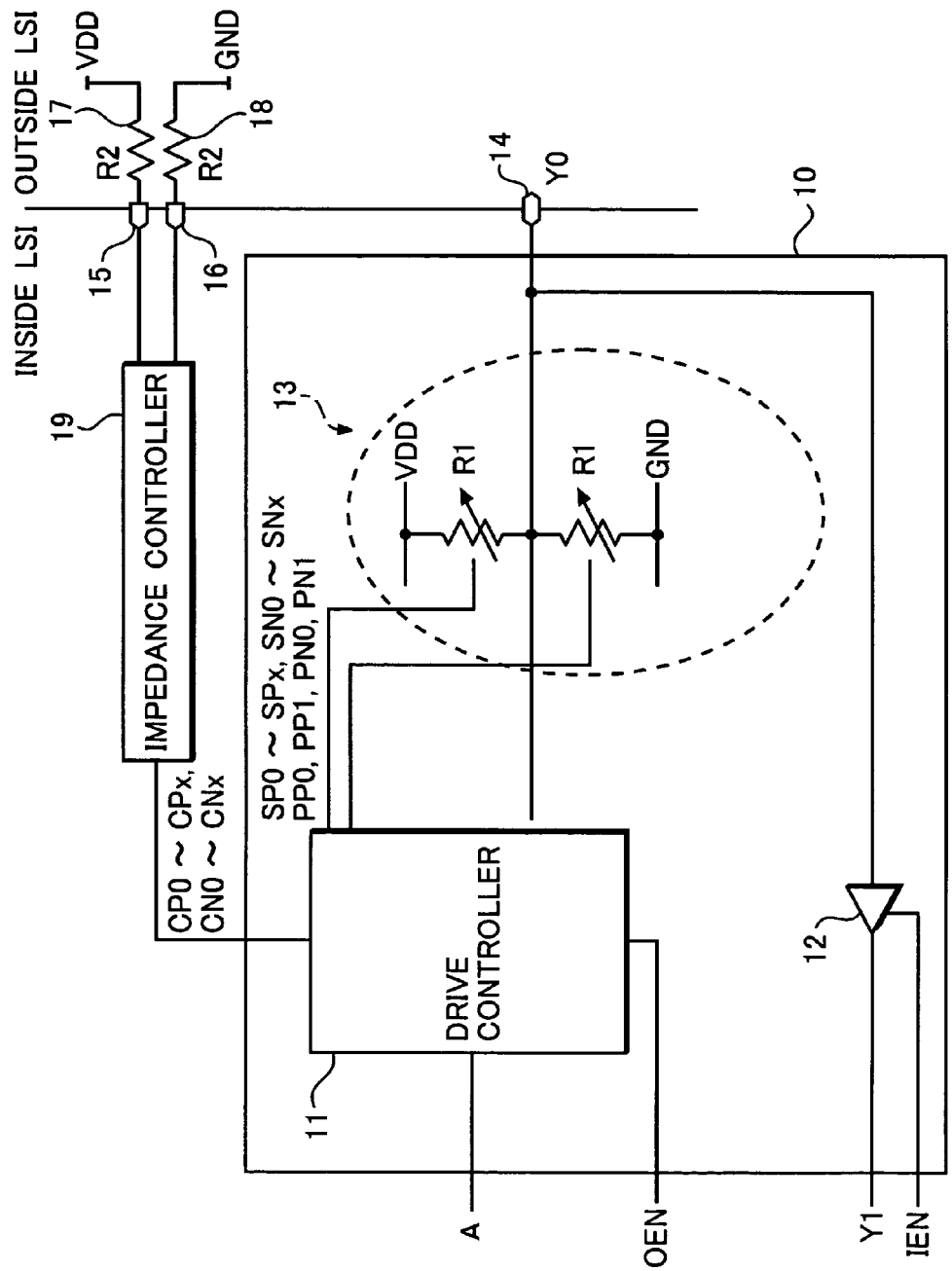
FIG. 2 is a block diagram illustrating a transistor structure in input mode in the I/O interface circuit.
Figure 3:
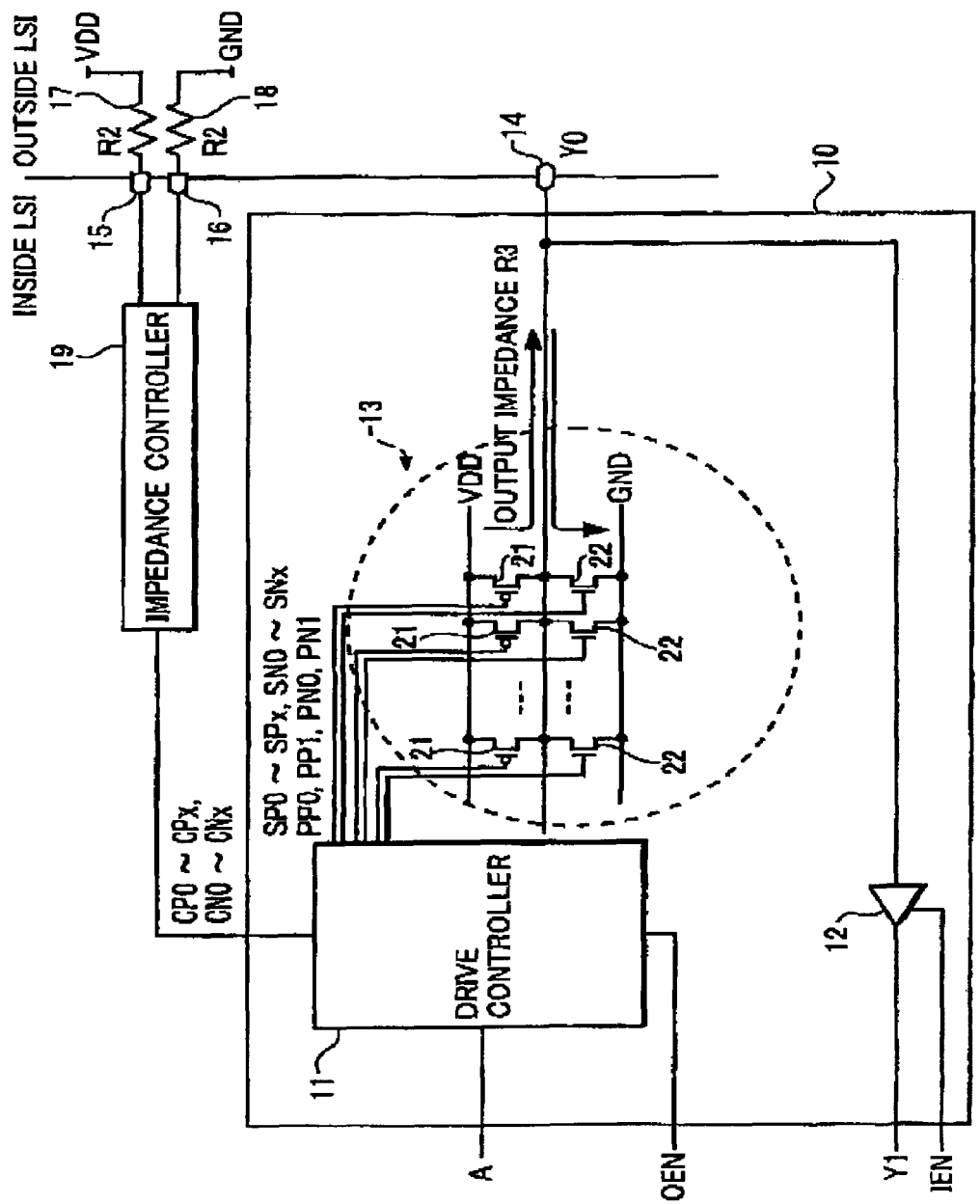
FIG. 3 is a block diagram illustrating a transistor structure in output mode in the I/O interface circuit.
Figure 4:
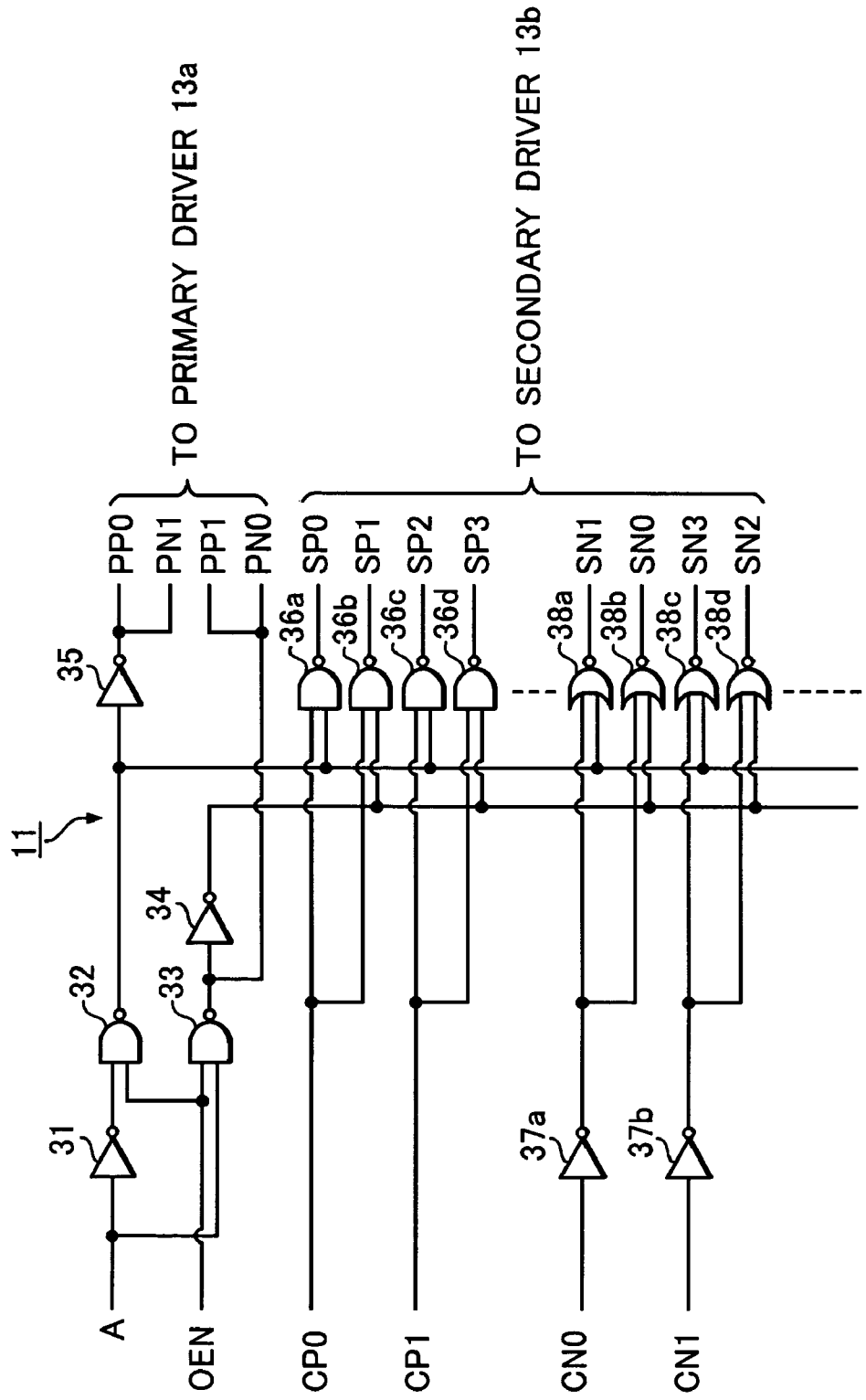
FIG. 4 is a circuit diagram of a drive controller.
Figure 5:
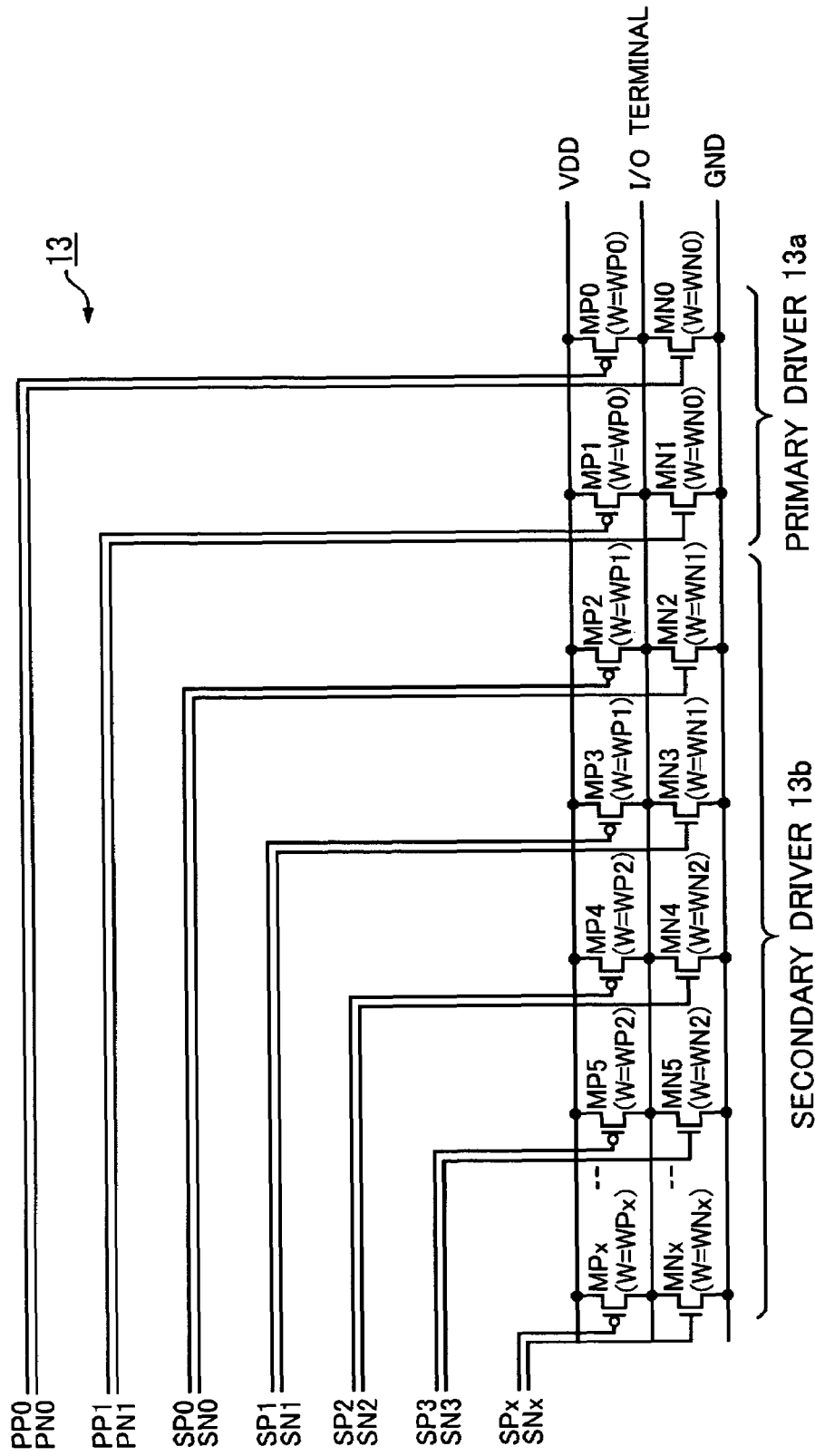
FIG. 5 is a circuit diagram of a driver.
Figure 6:
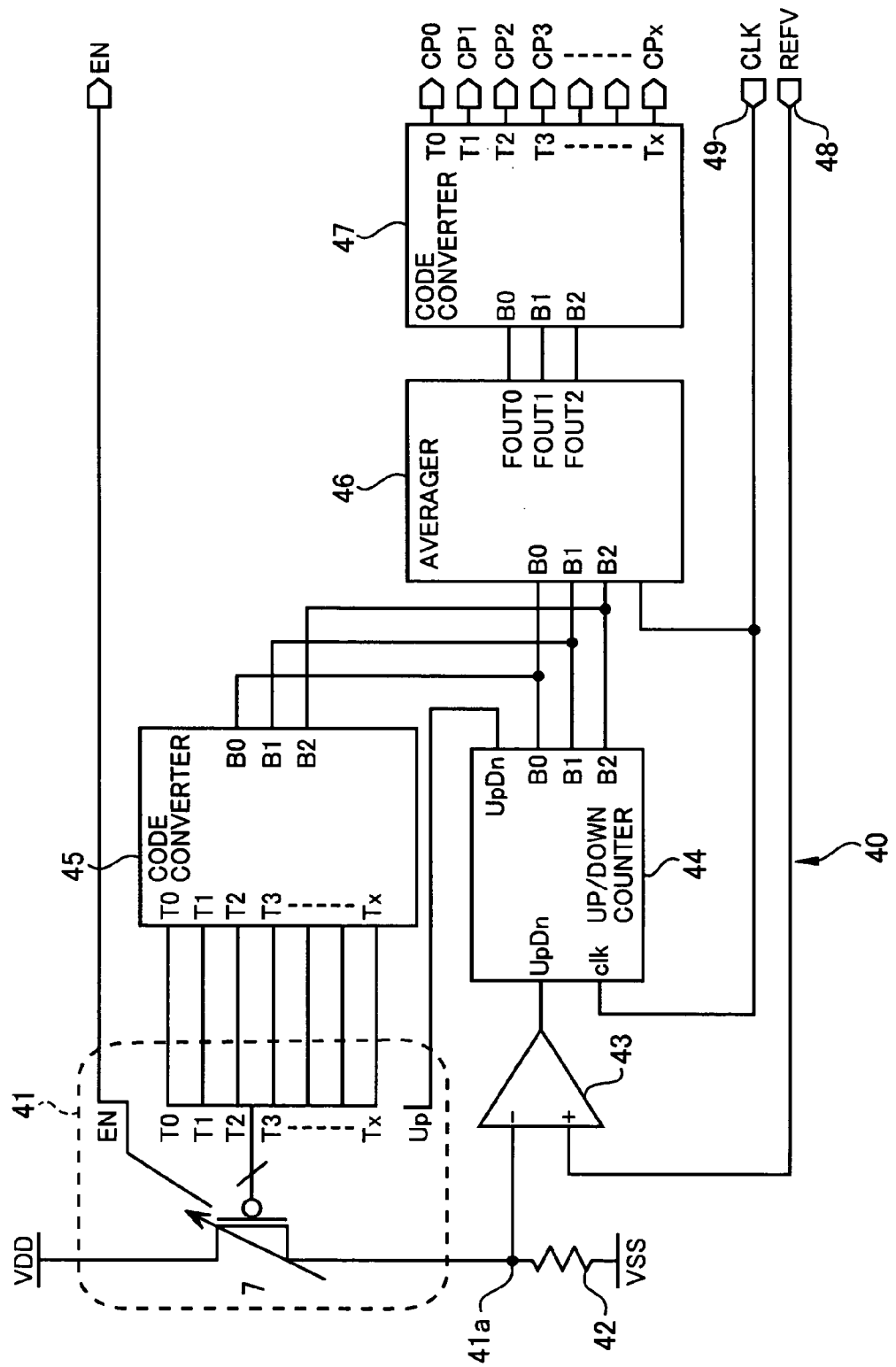
FIG. 6 is a block diagram illustrating an impedance controller.
Figure 8:
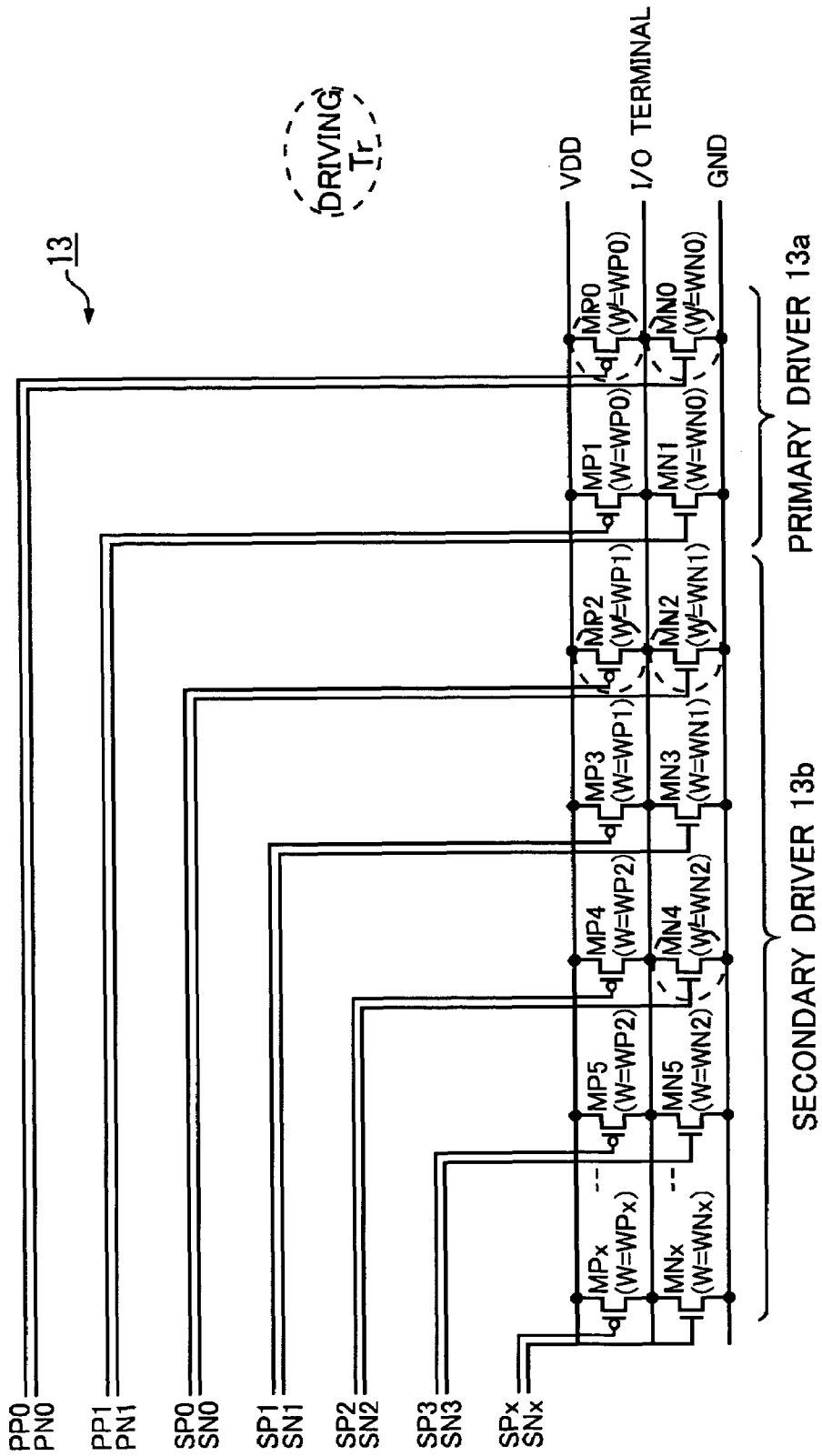
FIG. 8 is a circuit diagram illustrating a driver under temperature changes in input mode.
Figure 9:
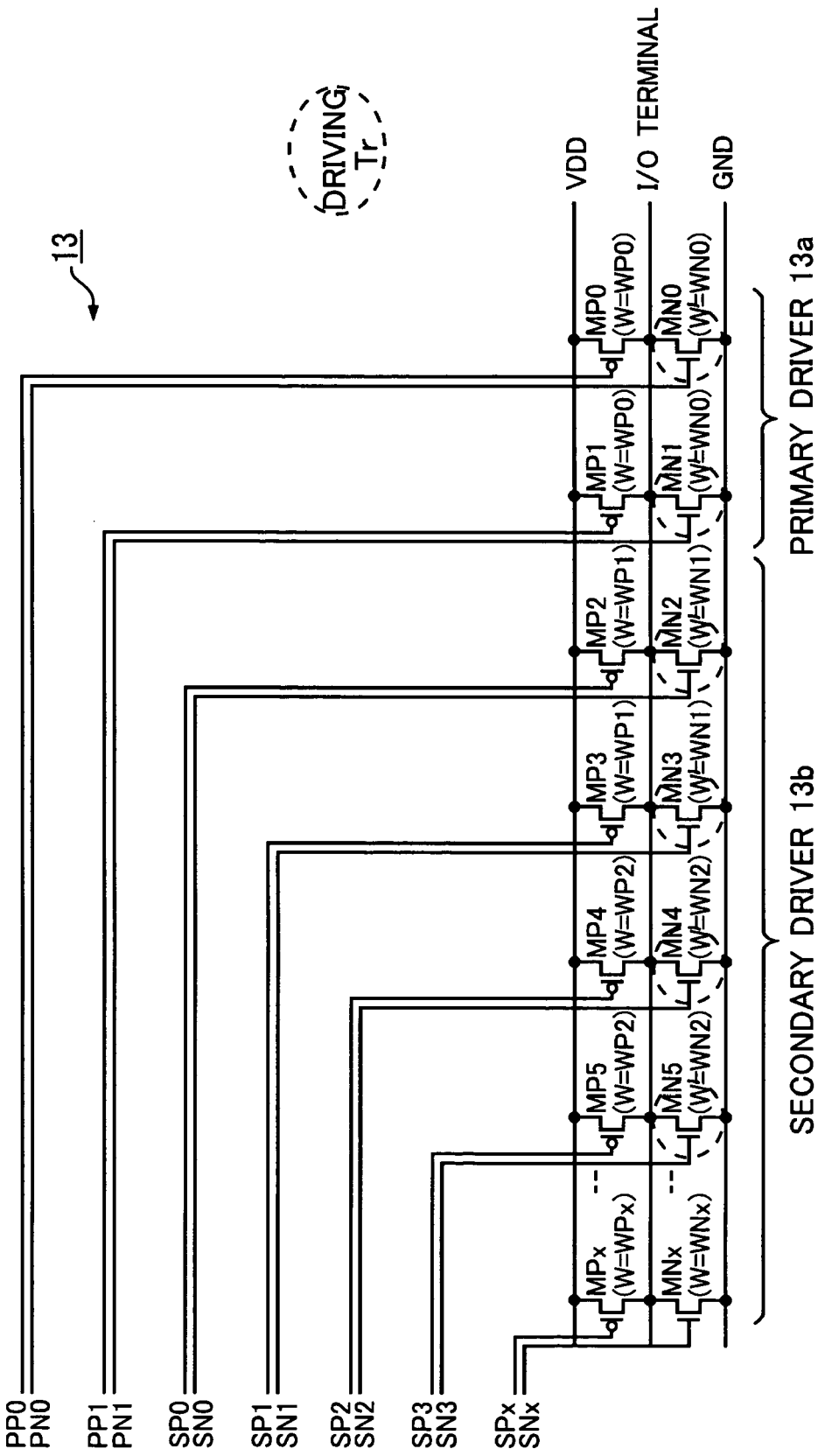
FIG. 9 is a circuit diagram illustrating a driver when an output signal A is Low in output mode.
Figure 10:
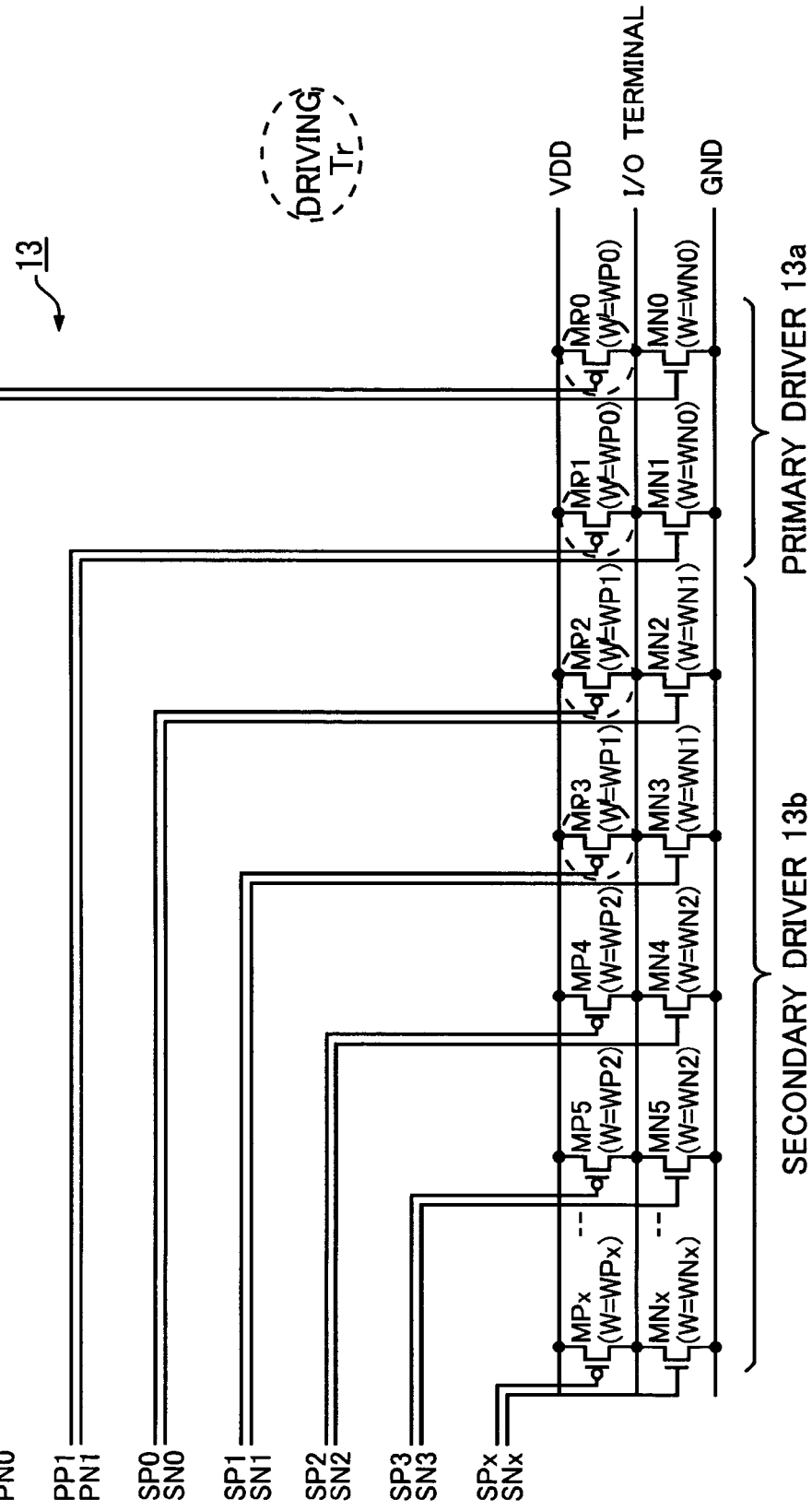
FIG. 10 is a circuit diagram illustrating a driver when an output signal A is High in output mode.
Figure 11:
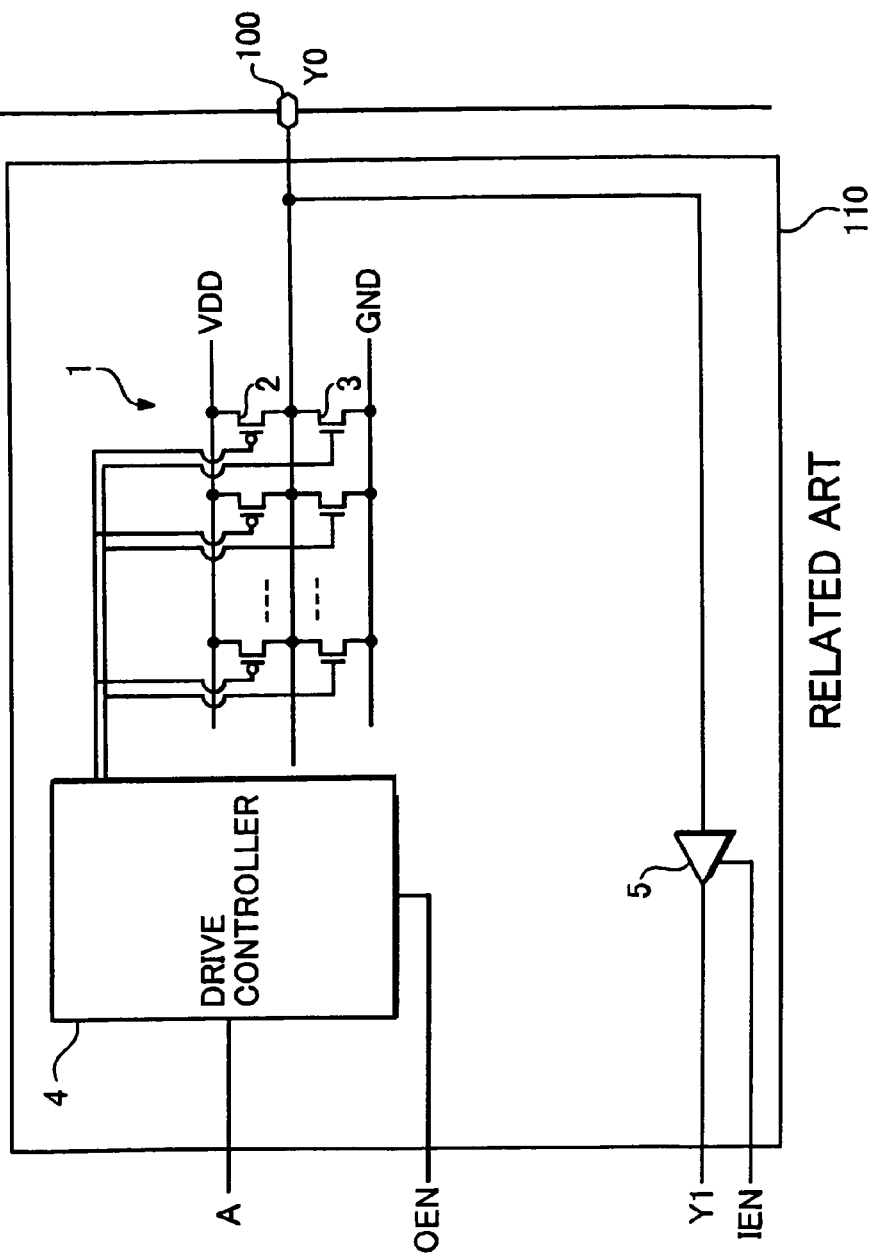
FIG. 11 is a block diagram illustrating a conventional I/O interface circuit.

An embodiment of the present invention is explained hereinafter with reference to the drawings. FIG. 1 is a block diagram showing an I/O interface circuit according to a first embodiment of the invention. FIGS. 2 and 3 are diagrams to explain a circuit configuration in input mode and output mode, respectively. FIG. 4 is a circuit diagram showing a drive controller. FIG. 5 is a circuit diagram showing a driver. FIGS. 6 and 7 are a block diagram and a chart, respectively, showing an impedance controller. FIGS. 8, 9, and 10 are circuit diagrams showing the circuit operation according to this embodiment.

An I/O interface circuit 10 of FIG. 1 is connected to an I/O terminal 14 connected to a transmission line outside a LSI. The I/O interface circuit 10 includes a driver 13 as an output circuit (output buffer) and an input circuit (input buffer) 12. In the driver 13, a plurality of pairs of Pch transistors 21 and Nch transistors 22 are connected in series between a supply voltage VDD and a ground voltage GND. The Pch transistor 21 serves as a first transistor, and the Nch transistor 22 as a second transistor. The supply voltage VDD serves as a first power source, and the ground voltage GND as a second power source. The connection points between the Pch transistors 21 and the Nch transistors 22 are all connected to the I/O terminal 14. A drive controller 11 supplies a control signal to each of the gates of the Pch transistors 21 and Nch transistors 22, thereby turning on or off the transistor. An impedance controller 19 is connected to the drive controller 11. The impedance controller 19 outputs an impedance control signal to control the impedance of the driver 13 according to resistance of reference resistors 17 and 18. The impedance controller 19 and the drive controller 11 constitute a controller of the driver 13.

As shown in FIG. 5, the driver 13 is constituted by a plurality of pairs of the Pch transistors 21 and the Nch transistors 22. Two pairs of the Pch and Nch transistors 21 and 22 make a set of four. Two Pch transistors 21 and two Nch transistors 22 in one set each have the same on-resistance value. The driver 13 includes a primary driver 13a and a secondary driver 13b.

The primary driver 13a is constituted by two transistor pairs as a first set. The two transistor pairs are composed of a transistor pair of Pch and Nch transistors MP0 and MN0, and a transistor pair of Pch and Nch transistors MP1 and MN1.

The primary driver 13a is constituted by two or an even number of transistor pairs as a second or later set. The two or an even number of transistor pairs are composed of a transistor pair of Pch and Nch transistors MP2 and MN2, a transistor pair of Pch and Nch transistors MP3 and MN3, a transistor pair of Pch and Nch transistors MP4 and MN4, a transistor pair of Pch and Nch transistors MP5 and MN5 and so on, to a transistor pair of Pch and Nch transistors MP (x-1) and MN (x-1), and a transistor pair of Pch and Nch transistors MPx and MNx.

In the primary driver 13a, the Pch transistors MP0 and MP1 have the same channel width W, WP0, and the same on-resistance, and the Nch transistors MN0 and MN1 have the same channel width W, WN0, and the same on-resistance. Similarly, in the secondary driver 13b, the Pch transistors MP2 and MP3 have the same channel width W, WP1, and the same on-resistance, and the Nch transistors MN2 and MN3 have the same channel width W, WN1, and the same on-resistance. In this way, in a set of two transistor pairs, two Pch transistors have the same channel width W and the same on-resistance value, and two Nch transistors have the same channel width W and the same on-resistance value.

The drive controller 1 receives an output signal A from inside the LSI. The output signal A is then supplied to the driver 13 and outputted to the I/O terminal 14. On the other hand, the I/O terminal 14 receives an input signal from outside the LSI. The input signal is then supplied inside the LSI through the input circuit 12 as an input signal Y1. The drive controller 11 is controlled by an output enable signal OEN. The input circuit 12 is controlled by an input enable signal IEN.

A reference resistor 17 is connected to a supply voltage VDD and a reference resistor 18 is connected to a ground voltage GND, outside the LSI. The reference resistors 17 and 18 have the same resistance, R2. The reference resistors 17 and 18 are connected to the impedance controller 19 inside the LSI via terminals 15 and 16, respectively. The resistance R2 of the reference resistors 17 and 18 corresponds to impedance of the transmission line. For example, the resistance R2 is proportionally twice the size of the impedance of the transmission line. Thus, the resistance R2 corresponds to resistance R1 of a Thevenin terminator, which is described later. The impedance controller 19 outputs control signals CP0 to CPx and CN0 to CNx to the drive controller 11. The drive controller 11 outputs control signals PP0, PP1, PN0, PN1, SP0 to SPx, and SN0 to SNx, to the gate of each transistor of the driver 13.

As shown in FIG. 4, the drive controller 11 includes inverters 31, 34, 35, 37a, 37b, and NANDs 32, 33, 36a to 36d, and NORs 38a to 38d. The output signal A from inside the LSI is inverted by the inverter 31 and inputted to one input of the NAND 32. The output enable signal OEN is inputted to the other input of the NAND 32. The output from the NAND 32 is inverted by the inverter 35 and then outputted the primary driver 13a as signals PP0 and PN1. The output signal A and the output enable signal OEN are also inputted to the NAND 33. The output from the NAND 33 is outputted to the primary driver 13a as signals PP1 and PN0.

The control signal CP0 from the impedance controller 19 is inputted to the NANDs 36a and 36b. The output from the NAND 32 is also inputted to the NAND 36a, and the output from the inverter 34 is also inputted to the NAND 36b. Similarly, the control signal CP1 is inputted to the NANDs 36c and 36d. The output from the NAND 32 is also inputted to the NAND 36c, and the output from the inverter 34 is also inputted to the NAND 36d. In this way, the control signals SP0 to SPx to the Pch transistors of the secondary driver 13b of the driver 13 are generated from the control signals CP0 to CPx from the impedance controller 19.

The control signal CN0 from the impedance controller 19 is inverted by the inverter 37a and inputted to the NORs 38a and 38b. The output from the NAND 32 is also inputted to the NOR 38a, and the output from the inverter 34 is also inputted to the NOR 38b. Similarly, the control signal CN1 is inverted by the inverter 37b and inputted to the NORs 38c and 38d. The output from the NAND 32 is also inputted to the NOR 38c, and the output from the inverter 34 is also inputted to the NOR 38d. In this way, the control signals SN0 to SNx to the Nch transistors of the secondary driver 13b of the driver 13 are generated from the control signals CN0 to CNx from the impedance controller 19.

As shown in FIG. 5, the drive signals PP0 and PN0 are inputted to the gates of the Pch transistor MP0 and the Nch transistor MN0, respectively, of the primary driver 13a. The drive signals PP1 and PN1 are inputted to the gates of the Pch transistor MP1 and the Nch transistor MN1, respectively, of the primary driver 13a. The drive signals SP0 and SN0 are inputted to the gates of the Pch transistor MP2 and the Nch transistor MN2, respectively, of the secondary driver 13b. The drive signals SP1 and SN1 are inputted to the gates of the Pch transistor MP3 and the Nch transistor MN3, respectively, of the secondary driver 13b. Further, the drive signals SP2 and SN2 are inputted to the gates of the Pch transistor MP4 and the Nch transistor MN4, respectively, of the secondary driver 13b. The drive signals SP3 and SN3 are inputted to the gates of the Pch transistor MP5 and the Nch transistor MN5, respectively, of the secondary driver 13b. In this way, the drive signals of SP4 and SN4 to SPx and SNx are inputted to the gates of the other Pch and Nch transistors of the secondary driver 13b.

The impedance controller 19 outputs control signals CP0 to CPx, and CN0 to CNx to control the number of transistors 21, 22 of the driver 13 to be turned on, to the drive controller 11. The impedance controller 19 outputs the control signals in correspondence with, or, for example, in proportional to, the resistance R2 of the reference resistors 17 and 18. Thus, when the output impedance and Thevenin termination resistance determined by the on-resistance of the MOS transistors 21 and 22 are deviated from a predetermined value determined by the resistance R2 due to variation in process conditions or change in the LSI temperature, the impedance controller 19 controls the number of driving transistors of the secondary driver 13b in such a way that the output impedance and Thevenin termination resistance match be the predetermined value.

FIG. 6 shows an example of the impedance controller 19. The impedance controller 19 includes a circuit 40 for controlling on and off of the Pch transistors 21 of the secondary driver 13b. The impedance controller 19 also includes a circuit (not shown) for controlling on and off of the Nch transistors 22 of the secondary driver 13b. Thus, the impedance controller 19 includes a detector having a first detector element with the same characteristics as the Pch transistors 21, and a detector having a second detector element (not shown) with the same characteristics as the Nch transistors 22. The impedance controller 19 of this embodiment has a Pch detector transistor 7 as the first detector element, and a Nch detector transistor (not shown) as the second detector element.

The circuit 40 in the impedance controller 19 shown in FIG. 6 has an impedance adjuster 41. In one case, the circuit 40 receives a reference voltage REFV from the reference resistor 17 connected to the VDD via a terminal 48. In this case, the terminal 48 is an equivalent of the terminal 15 of FIG. 1. The reference voltage REFV is then inputted to one input (positive input) terminal of a comparator 43. The impedance adjuster 41 and a resistor 42 are connected in series between a supply voltage VDD and a voltage VSS. The connection point 41a of the impedance adjuster 41 and the resistor 42 is connected to a negative input terminal of the comparator 43. The voltage VSS is a voltage between the VDD and the GND. The Pch detector transistor 7 detects a change in the process conditions of the impedance adjuster 41 and the temperature of the LSI. The Pch detector transistor 7 therefore has the same transistor characteristics as the Pch transistors 21 of the driver 13 to serve as a detector element of the Pch transisistors 21. Thus, a change in the impedance of the Pch detector transistor 7 is detected as a change in the impedance of the Pch transistors 21 of the driver 13.

An output from the comparator 43 is inputted to an up/down counter 44. The up/down counter 44 counts up and down according to the signal from the comparator 43 in synchronization with a clock signal CLK supplied through a terminal 49.

The comparator 43 compares a comparative voltage on the connection point 41a with the reference voltage REFV, and outputs an up signal (High) if the reference voltage REFV is higher than the comparative voltage, and outputs a down signal (Low) if it is lower than the comparative voltage. On each clock cycle, the up/down counter 44 counts up (increments) one binary value when the signal from the comparator 43 is High, and counts down (decrements) one binary value when it is Low. Further, the up/down counter 44 outputs a count value (binary code or binary value) composed of B0, B1, and B2 to a code converter 45 and an averager 46 on each clock cycle.

The code converter 45 converts the binary code composed of B0, B1, and B2 from the up/down counter 44 to a thermometer code composed of T0, T1, T2, T3, and so on to Tx, as shown in the conversion table of FIG. 7, and outputs it to the impedance adjuster 41. If the signal from the comparator 43 is High, the impedance adjuster 41 reduces its impedance to increase the comparative voltage on the connection point 41a.

On the other hand, the binary codes from the up/down counter 44 are sequentially inputted to the averager 46. The averager 46 retains the binary codes, adds four sets of the binary codes, for example, and divides the sum by four. The averager 46 then outputs the averaged binary code. The binary code which is inputted to the averager 46 each time is composed of three bits of count value: B0, B1, and B2, and the averaged binary code outputted from the averager 46 is composed of three bits of codes: FOUT0, FOUT1, and FOUT2.

The averaged binary codes, FOUT0, FOUT1, and FOUT2, are then inputted to a code converter 47. The code converter 47 converts the codes into the thermometer codes of six bits: T0, T1, T2, T3, and so on to Tx, based on the conversion table of FIG. 7, and outputs them as CP0, CP1, CP2, CP3, and so on to CPx.

In the other case, the circuit 40 of the impedance controller 19 receives a reference voltage REFV from the reference resistor 18 connected to the GND via a terminal 48. In this case, the terminal 48 is an equivalent of the terminal 16 of FIG. 1. The code converter 47 outputs the thermometer codes of CN0, CN1, CN2, CN3, and so on to CNx. The Nch detector transistor, which detects a change in the process conditions of the impedance adjuster 41 and the temperature of the LSI, has the same transistor characteristics as the Nch transistors 22 of the driver 13. Thus, a change in the on-resistance of the Nch detector transistor corresponds to a change in the impedance of the Nch transistors 22.

The thermometer codes CP0, CP1, CP2, CP3, and so on to CPx, and the thermometer codes CN0, CN1, CN2, CN3, and so on to CNx are inputted to the drive controller 11 as impedance controller control signals.

The operation of the I/O interface circuit 10 having the above structure is explained hereinafter. In the case of using the I/O interface circuit 10 in the input mode, the input enable signal IEN is set High, and the output enable signal OEN is set Low. The drive controller 11 of FIG. 4 thereby outputs a signal where PP0 and PN1 are Low and PP1 and PN0 are High to the primary driver 13a. Thus, in the primary driver 13a of the driver 13 shown in FIG. 5, a pair of the Pch transistor MP0 and the Nch transistor MN0 are turned on and a pair of the Pch transistor MP1 and the Nch transistor MN1 are turned off. Hence, if the signal from the impedance controller 19 turns off all the transistors of the secondary driver 13b, in the drive circuit 13, the Pch transistor 21 (MPO) and the Nch transistor 22 (MNO) are connected in series between the power supply voltage VDD and the ground voltage GND, forming Thevenin terminator, as shown FIG. 2. The connection point of the Pch transistor 21 and the Nch transistor 22 constituting the Thevenin terminator is connected to the I/O terminal 14. If the on-resistance of the Pch and Nch transistors 21 and 22 of the terminator is R1, their combined resistance R½ is set equal to the impedance of the transmission line. The load impedance in the input mode thereby matches the impedance of the transmission line. The signal inputted through the I/O terminal 14 is thereby supplied inside the LSI through the input circuit 12 as an input signal Y1.

On the other hand, in the case of using the I/O interface circuit 10 in the output mode, the output enable signal OEN is set High, and the input enable signal IEN is set Low. This turns on either the Pch transistors MP0 and MP1, or the Nch transistors MN0 and MN1 of the primary drivers 13a of FIGS. 4 and 5. If the output signal A is High, the Pch transistors MP0 and MP1 having the same on-resistance are turned on, and the Nch transistors MN0 and MN1 are turned off. If, on the contrary, the output signal A is Low, the Nch transistors MN0 and MN1 having the same on-resistance are turned on, and the Pch transistors MP0 and MP1 are turned off. Thus, in the output mode, input of the output signal A of High level causes the Pch transistors MP0 and MP1 to be both turned on to constitute a drive transistor, while input of the output signal A of Low level causes the Nch transistors MN0 and MN1 to be both turned on to constitute a drive transistor. The driver 13 with output impedance R3 is thereby configured as shown FIG. 3. Since the Pch transistors MP0 and MP1 have the same channel width W of WP0 and the same on-resistance, if the Pch transistors MP0 and MP1 are turned on, the output impedance of R3=K/(WP0+WP0)=K/2WP0=(½)(K/WP0)=(½)R1, where K is a constant, is generated between the supply voltage VDD and the voltage of the I/O terminal 14. Thus, the output impedance R3 is: R3=(½)R1=(½)R2.

Since the Thevenin termination is formed in the input mode, the I/O interface circuit 10 is equivalent with a circuit in which half resistance ((½)R1) is terminated with a half voltage. Hence, the load impedance in the input mode and the output impedance R3 in the output mode are the same. It is thereby possible to equalize the load impedance in the input mode and the output impedance R3 in the output mode, and match the load and output impedance with the impedance of the transmission line.

In the output mode, high level of the output signal A from the LSI is outputted from the I/O terminal 14 through the Pch transistors MP0 and MP1 connected to the supply voltage VDD. On the other hand, Low level of the output signal A is outputted from the I/O terminal 14 through the Nch transistors MN0 and MN1 connected to the ground voltage GND.

A change in the temperature of the LSI or variation in the condition of manufacture (process variation) causes output impedance and Thevenin resistance determined by the on-resistance R1 of the Pch transistors MP0 and MP1 and the on-resistance R1 of the Nch transistors MN0 and MN1 to be deviated from a predetermined value determined by the resistance R2 of the reference resistors 17 and 18. When the output impedance and Thevenin resistance of the primary driver 13a in the driver 13 are deviated from the predetermined value, the impedance of the impedance adjuster 41 (Pch transistor or Nch transistor) in the impedance controller 19 is also deviated from the predetermined value. The code converter 47 therefore outputs control signals CP0, CP1, CP2, and so on to CPx, and CN1, CN2, CN3, and so on to CNx based on the comparison result of the comparator 43 in the impedance controller 19.

In the input mode, if the resistance of the Pch transistor corresponding to MP0 increases to reduce the comparative voltage on the connection point 41a, causing the up/down counter 44 to increment a certain number, which is determined as one binary value by the averager 46, the code converter 47 outputs a control signal of CP= . . . 001, in which CP0 is 1 and other codes of CP1, CP2, to CPx are 0, as shown in FIG. 7. On the other hand, if the resistance of the Nch transistor corresponding to MN0 increases to reduce the comparative voltage on the connection point 41a, causing the up/down counter 44 to increment a certain number, which is determined as two binary values by the averager 46, the code converter 47 outputs a control signal of CN= . . . 011, in which CN0 and CN1 are 1 and other codes of CP2, to CPx are 0.

This turns on the Pch transistor MP2, Nch transistors MN2 and MN4 of the secondary driver 13b in addition to the Pch transistor MP0 and Nch transistor MN0 of the primary driver 13a, as shown in FIG. 8. The resistance of the Pch transistors 21 in the VDD side (MP0, MP2), and the Nch transistors 22 in the GND side (MN0, MN2, MN4) thereby matches the reference resistance R2. In this way, the transistors of the secondary driver 13b are turned on to control the resistance of the Pch transistors 21 and the resistance of the Nch transistors 22 based on the reference resistance R2. This allows the resistance of the Thevenin terminator to be a constant predetermined value in spite of changes in the LSI temperature or variation in the process conditions. It is thereby possible to form the terminator independent of temperature changes and variation in process conditions in the input mode.

On the other hand, in the output mode, if the output signal is Low, the impedance controller 19 outputs the control signals of CP= . . . 001, and CN= . . . 011. This turns on the Nch transistors MN2, MN3, MN4, and MN5 of the secondary driver 13b in addition to the Nch transistors MN0 and MN1 of the primary driver 13a, as shown in FIG. 9. The other transistors remain off.

On the contrary, if the output signal is High in the output mode, the impedance controller 19 outputs the control signals of CP= . . . 001, and CN= . . . 011. This turns on the Pch transistors MP2 and MP3 of the secondary driver 13b in addition to the Pch transistors MP0 and MP1 of the primary driver 13a, as shown in FIG. 10. The other transistors remain off.

In this way, in the output mode, the output impedance of the Nch transistors MN0, MN1, MN2, MN3, MN4, and MN5 when the output signal is Low, and the output impedance of the Pch transistors MP0, MP1 MP2 and MP3 when the output signal is High are controlled based on the reference resistance R2. This allows the output impedance R3 to be a constant predetermined value in spite of changes in the LSI temperature and variation in the process conditions. It is thereby possible to form the output impedance independent of temperature changes and variation in process conditions in the output mode.

The impedance controller 19 of the present invention is not limited to the one described in the above embodiment. For example, when the on-resistance of the transistors of the driver 13 varies, it is possible to directly input the count value of the up/down counter 44 to the code converter 47 and use the thermometer code CP0 to CPx and CN0 to CNx as a control signal to turn on or off the transistors of the driver 13. However, it is preferred to employ the averager 46 to average the count value of the up/down counter 44 with a plurality of input count values, input the averaged value to the code converter 47, and use the thermometer code CP0 to CPx and CN0 to CNx as a control signal to turn on or off the transistors of the driver 13 as described above since this allows more stable control. If the comparative voltage on the connection point 41a varies to be close to the reference voltage due to temperature changes and so on, the comparison result of the comparator 43 becomes indeterminate between up-counting or down-counting the up/down counter 44. This is the same when the comparative voltage exceeds or falls below the upper and lower limit of an offset voltage of the comparator 43 from the reference voltage due to noise. The offset voltage of the comparator is a voltage to cause an error in determining if the comparative voltage is higher or lower than the reference voltage. The up/down counter 44 thereby varies among a count value corresponding to the reference voltage, a count value of one step higher, and a count value of one step lower. By averaging the count value, it is possible to prevent the variation in the comparative voltage from affecting impedance matching data.

It is apparent that the present invention is not limited to the above embodiment, that may be modified and changed without departing from the scope and spirit of the invention.

What is claimed is:

1. An input/output interface circuit of an integrated circuit, comprising:
   a plurality of transistor pairs;
   an input/output terminal being connected to a connection point of each transistor pair of the plurality of transistor pairs; and
   a controller controlling switching of each transistor of the plurality of transistor pairs to constitute an output buffer in output mode and a termination circuit in input mode, and controlling output impedance of the output buffer and load impedance of the termination circuit to be a predetermined value,
   wherein said plurality of transistor pairs constitute a driver including a primary driver and a secondary driver, and the flue controller comprises a drive controller, controlling switching of each transistor of the driver, and an impedance controller outputting an impedance control signal to the drive controller which generates a control signal for controlling said secondary driver and for controlling impedance of the driver based on reference resistance,
   wherein said primary driver is controlled other than by said impedance controller, and
   wherein the plurality of transistor pairs include a plurality of transistor sets, each set consisting of two transistor pairs including two first transistors and two second transistors, each having the same on-resistance, in which:
   in input mode, one of two transistor pairs of a first set is turned on and the first transistor and/or the second transistor of a second, or later set are selectively turned on; and
   in output mode, two first transistors or two second transistors of the first set are turned on and the first transistor or the second transistor of the second or later set is selectively turned on.

2. The input/output interface circuit of an integrated circuit according to claim 1, wherein said controller controls said output and load impedances using an impedance control signal which is based on an averaged count from an up/down counter which one of increments and decrements a count in a cycle based on a comparison result between a reference voltage and a comparative voltage.

3. The input/output interface circuit of an integrated circuit according to claim 1, wherein each transistor pair of the plurality of transistor pairs includes a first transistor of a first conductive type being connected to a first power source, and a second transistor of a second conductive type being connected to a second power source with a lower voltage than the first power source, the first and second transistors being connected in series.

4. The input/output interface circuit of an integrated circuit according to claim 3, further comprising:
   an input circuit being connected to the input/output terminal through which an input signal from the input/output terminal is supplied to the integrated circuit.

5. The input/output interface circuit of an integrated circuit according to claim 1, wherein each transistor pair of the plurality of transistor pain includes a first transistor of a first conductive type being connected to a first power source, and a second transistor of a second conductive type being connected to a second power source with a lower voltage than the first power source, the first and second transistors being connected in series,
   wherein in input mode, one or a selected plurality of transistor pairs of the plurality of transistor pairs are turned on to constitute a Thevenin terminator; and
   wherein in output mode, two or a selected plurality of first transistors or two or a selected plurality of second transistors of the plurality of transistor pairs are turned on to constitute an output driver, the selected plurality of transistor pairs or first or second transistors being selected in such a way that a combined impedance of the transistor pairs constituting the Thevenin terminator or the transistors constituting the output driver is proportional to a reference resistance.

6. The input/output interface circuit of an integrated circuit according to claim 5, further comprising:
an input circuit being connected to the input/output terminal, through which an input signal from the input/output terminal is supplied to the integrated circuit.

7. The input/output interface circuit of an integrated circuit according to claim 1, wherein each transistor pair of the plurality of transistor pairs includes a first transistor of a first conductive type being connected to a first power source, and a second transistor of a second conductive type being connected to a second power source with a lower voltage than the first power source, the first and second transistors being connected in series, and
wherein the plurality of transistor pairs constitute a driver including a plurality of transistor sets, each act consisting of two transistor pairs including two first transistors and two second transistors, each having the same on-resistance,
wherein the controller comprises a drive controller controlling switching of each transistor of the driver,
wherein in input mode, the drive controller turns on one of the two transistor pairs of a first set to constitute a Thevenin terminator and selectively turns on transistor pairs of a second or later sets in such a way that combined impedance of the driver is proportional to a reference resistance; and
wherein in output mode, the drive controller turns on two first transistors or two second transistors of the first set to form combined impedance and selectively turns on a transistor of the second or later sets in such a way that the combined impedance of the driver is proportional to said reference resistance.

8. The input/output interface circuit of an integrated circuit according to claim 7, wherein the drive controller sets the driver in the output mode in accordance with an output enable signal, and outputs an output signal from the integrated circuit to the input/output terminal through the driver.

9. The input/output interface circuit of an integrated circuit according to claim 7,
wherein the drive controller controls switching of each transistor of the second or later sets in accordance with the impedance control signal.

10. The input/output interface circuit of an integrated circuit according to claim 9, wherein the impedance controller comprises a comparator receiving said reference voltage based on the reference resistance and said comparative voltage which is based on the impedance of the driver, said up/down counter incrementing or decrementing one count each cycle based on output from the comparator indicating said comparison result of the reference voltage and the comparative voltage, and
wherein the impedance controller outputs an impedance control signal selecting the number of transistors to be turned on from the transistors forming the combined impedance in accordance with a count of the up/down counter.

11. The input/output interface circuit of an integrated circuit according to claim 7, further comprising:
an input circuit being connected to the input/output terminal, through which an input signal from the input/output terminal is supplied to the integrated circuit.

12. The input/output interface circuit of an integrated circuit according to claim 1,
wherein each transistor pair of the plurality of transistor pairs includes a first transistor of a first conductive type being connected to a first power source, and a second transistor of a second conductive type being connected to a second power source with a lower voltage than the first power source, the first and second transistors being connected in series,
wherein the plurality of transistor pairs include a plurality of transistor sets, each set consisting of two transistor pairs including two first transistors and two second transistors, each having the same on-resistance,
wherein the plurality of transistor pairs constitute a driver including a primary driver having a first transistor set, and a secondary driver having one or a plurality of transistor sets different from the first transistor set,
wherein in input mode, the drive controller turns on one of two transistor pairs of the primary driver and selectively turns on a transistor of the secondary driver in accordance with the impedance control signal, and in output mode, the drive controller selectively turns on two first transistors or two second transistors of the primary driver and selectively turns on two first transistors or two second transistors of one or a plurality of transistor sets of the secondary driver in accordance with the impedance control signal.

13. The input/output interface circuit of an integrated circuit according to claim 12, wherein the drive controller sets the driver in the output mode in accordance with an output enable signal, and outputs an output signal from the integrated circuit to the input/output terminal through the driver.

14. The input/output interface circuit of an integrated circuit according to claim 13, wherein the drive controller selectively turns on the first transistor or the second transistor in accordance with the output signal in the output mode.

15. The input/output interface circuit of an integrated circuit according to claim 12, wherein the impedance controller comprises a comparator receiving said reference voltage based on the reference resistance and said comparative voltage which is based on the impedance of the driver, said up/down counter incrementing or decrementing one count each cycle based on output from the comparator indicating said comparison result of the reference voltage and the comparative voltage, and
wherein the impedance controller outputs an impedance control signal selecting the number of transistors to be turned on from the transistors forming the combined impedance in accordance with a count of the up/down counter.

16. The input/output interface circuit of an integrated circuit according to claim 15, wherein the impedance controller comprises an averager for averaging a plurality of sampling counts of the up/down, counter to output the impedance control signal selecting the number of transistors to be turned on from the transistors forming the combined impedance in accordance with an averaged count.

17. The input/output interface circuit of an integrated circuit according to claim 12, wherein the drive controller comprises a first controller controlling the primary driver, and a second controller controlling the secondary driver based on output from the first controller and the impedance control signal,
wherein when an output enable signal indicates output mode, the first controller outputs a drive signal for turning on one of two transistor pairs of the primary driver based on an output signal from inside the integrated circuit, and when the output enable signal indicates input mode, the first controller outputs a drive signal for turning on two first transistors or two second transistors of the primary driver, and wherein the second controller controls a transistor set of the secondary driver selected by the impedance control signal based on the drive signal in the same manner as the transistor set of the primary driver.

18. The input/output interface circuit of an integrated circuit according to claim 1, wherein each transistor pair of the plurality of transistor pairs includes a first transistor of a first conductive type being connected to a first power source, and a second transistor of a second conductive type being connected to a second power source with a lower voltage than the first power source, the first and second transistors being connected in series, wherein the plurality of transistor pairs include a primary driver and a secondary driver, wherein the primary driver consists of two transistor pairs including two first transistors and two second transistors, each having the same on-resistance, p1 wherein in input mode, the controller turns on one of two transistor pairs of the primary driver and selectively turns on the first transistor and/or the second transistor of the secondary driver; and wherein in output mode, the controller turns on two first transistors or two second transistors of the primary driver and selectively turns on the first transistor or the second transistor of the secondary driver.

19. The input/output interface circuit of an integrated circuit according to claim 18, wherein the controller controls combined resistance of the primary and secondary drivers based on a reference resistance in the input mode, and controls output impedance of the primary and secondary drivers based on the reference resistance in the output mode.

20. The input/output interface circuit of an integrated circuit according to claim 19, wherein the controller comprises a detector for detecting variation in impedance of the first and second transistors of the primary driver based on the reference resistance, and controls switching of each transistor of the primary and secondary drivers based on a detection result of the detector.

21. The input/output interface circuit of an integrated circuit according to claim 20, wherein the detector comprises a first detector element including a first transistor having the same characteristics as the first transistor of the primary driver.

22. The input/output interface circuit of an integrated circuit according to claim 1, wherein said controller is controlled by an output enable signal that is low during said input mode and high during said output mode.

23. The input/output interface circuit of an integrated circuit according to claim 1, further comprising:

an input circuit that receives an input signal from outside of said integrated circuit, said input circuit being controlled by an input enable signal that is high during said input mode and low during said output made.

24. The input/output interface circuit for an integrated circuit according to claim 1, wherein said impedance controller comprises:

an impedance adjuster connected in series with a resistor between a source voltage VDD and a voltage VSS;

a comparator for comparing said reference voltage with a comparative voltage at a connection point between said impedance adjuster and said resistor, said comparison result output from said comparator being input to said up/down counter for incrementing or decrementing a count in a cycle based on said comparison result; and an averager for averaging binary codes from said up/down counter to generate averaged binary codes.

25. The input/output interface circuit for an integrated circuit according to claim 24, wherein said impedance controller further comprises:

a code converter for converting said binary codes output from said up/down counter to thermometer codes, and outputting said thermometer codes to said impedance adjuster, wherein an impedance of said impedance adjuster is adjusted based on said thermometer codes.

26. The input/output interface circuit for an integrated circuit according to claim 25, wherein said impedance controller further comprises:

another code converter for receiving said averaged binary codes from said averager, converting said average binary codes to thermometer codes, and outputting said thermometer codes as impedance control signals for selecting a number of transistors in said plurality of transistor pairs.

* * * * *